(12) United States Patent
Shen et al.

(10) Patent No.: US 9,905,523 B2
(45) Date of Patent: *Feb. 27, 2018

(54) MICROELECTRONIC ASSEMBLIES FORMED USING METAL SILICIDE, AND METHODS OF FABRICATION

(71) Applicant: Invensas Corporation, San Jose, CA (US)

(72) Inventors: Hong Shen, Palo Alto, CA (US); Liang Wang, Milpitas, CA (US); Arkalgud R. Sitaram, Cupertino, CA (US)

(73) Assignee: INVENSAS CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/203,013

(22) Filed: Jul. 6, 2016

(65) Prior Publication Data

US 2017/0018517 A1    Jan. 19, 2017

Related U.S. Application Data

(63) Continuation of application No. 14/629,271, filed on Feb. 23, 2015, now Pat. No. 9,502,347.

(51) Int. Cl.
*H01L 23/00* (2006.01)
*H01L 23/522* (2006.01)
(Continued)

(52) U.S. Cl.
CPC ............ *H01L 24/09* (2013.01); *H01L 21/486* (2013.01); *H01L 23/147* (2013.01);
(Continued)

(58) Field of Classification Search
CPC ... H01L 24/09; H01L 24/89; H01L 23/49838; H01L 23/147; H01L 23/49827; H01L 21/486; H01L 25/0657
See application file for complete search history.

(56) References Cited

U.S. PATENT DOCUMENTS 4,761,386 A    8/1988  Buynoski
5,387,555 A    2/1995  Linn et al.
(Continued)

FOREIGN PATENT DOCUMENTS

FR         2980036         3/2013

OTHER PUBLICATIONS

PCT/US2016/018953 PCT International Search Report and Written Opinion of the International Searching Authority, dated May 27, 2016; 12 pages.

*Primary Examiner* — Kyoung Lee
(74) *Attorney, Agent, or Firm* — Haynes and Boone, LLP

(57) ABSTRACT

Two microelectronic components (110, 120), e.g. a die and an interposer, are bonded to each other. One of the components' contact pads (110C) include metal, and the other component has silicon (410) which reacts with the metal to form metal silicide (504). Then a hole (510) is made through one of the components to reach the metal silicide and possibly even the unreacted metal (110C) of the other component. The hole is filled with a conductor (130), possibly metal, to provide a conductive via that can be electrically coupled to contact pads (120C.B) attachable to other circuit elements or microelectronic components, e.g. to a printed circuit board.

19 Claims, 11 Drawing Sheets

(51) Int. Cl.
    *H01L 23/532*     (2006.01)
    *H01L 25/065*     (2006.01)
    *H01L 23/14*     (2006.01)
    *H01L 23/498*     (2006.01)
    *H01L 21/48*     (2006.01)

(52) U.S. Cl.
    CPC .. *H01L 23/49827* (2013.01); *H01L 23/49838* (2013.01); *H01L 23/5226* (2013.01); *H01L 23/53209* (2013.01); *H01L 24/89* (2013.01); *H01L 25/0652* (2013.01); *H01L 25/0657* (2013.01); *H01L 2224/0401* (2013.01); *H01L 2224/08168* (2013.01); *H01L 2224/08501* (2013.01); *H01L 2224/73204* (2013.01); *H01L 2224/80487* (2013.01); *H01L 2224/80895* (2013.01); *H01L 2224/80896* (2013.01); *H01L 2924/05442* (2013.01); *H01L 2924/1304* (2013.01); *H01L 2924/15192* (2013.01); *H01L 2924/15311* (2013.01); *H01L 2924/3511* (2013.01)

(56) References Cited

U.S. PATENT DOCUMENTS

| | | |
|---|---|---|
| 7,901,989 B2 | 3/2011 | Haba et al. |
| 9,502,347 B2 * | 11/2016 | Shen .................. H01L 25/0652 |
| 2004/0124509 A1 | 7/2004 | Kim et al. |
| 2009/0224371 A1 | 9/2009 | Yu et al. |
| 2010/0224994 A1 | 9/2010 | Yun |
| 2011/0168434 A1 | 7/2011 | Mukta et al. |
| 2013/0015585 A1 | 1/2013 | Kosenko et al. |
| 2014/0203394 A1 | 7/2014 | Lin et al. |

* cited by examiner

MICROELECTRONIC ASSEMBLIES FORMED USING METAL SILICIDE, AND METHODS OF FABRICATION

CROSS REFERENCE TO RELATED APPLICATIONS

The present application is a continuation of U.S. patent application Ser. No. 14/629,271, filed Feb. 23, 2015, incorporated herein by reference.

BACKGROUND OF THE INVENTION

The present invention relates to microelectronic components such as integrated circuits (ICs), printed circuit boards, etc., and more particularly to attachment and electrical connection of microelectronic components to each other or to other circuitry.

Attachment and electrical connection of microelectronic components to each other or other circuitry must meet certain requirements with respect to high mechanical strength, low contact resistance, small size, and other properties. A common technique is to solder the contact pads of different components to each other. Solder attachments have low electrical resistance, can be mechanically strong, and can be quickly formed at low temperatures that do not damage a typical component (e.g. under 450° C.). On the negative side, a strong solder bond requires much solder which can spread sideways when melted and create electrical shorts. Alternative attachment techniques include diffusion bonding, i.e. when the contact pads of different components are bonded together by interdiffusion. However, if the process temperature is low, the diffusion bonding is slow. A still another technique is gluing the contact pads together by conductive or anisotropic adhesive, but the resulting contact resistance can be high.

FIG. 1 illustrates a conventional IC package with semiconductor die 110 attached to a printed circuit board 116 through an interposer (ITP) 120. A die 110 is a semiconductor IC originally manufactured in the same semiconductor wafer (not shown) as some other die and then separated from the wafer. Die 110 are not attached to PCB 116 directly for various reasons. One reason is that the PCB contact pads 116C cannot be positioned as closely together as the die's contact pads 110C due to different fabrication technologies used for the die and the PCB. ITP 120 provides "contact redistribution": the ITP's top contact pads 120C.T match the die's contact pads 110C, and ITP's bottom contact pads 120C.B match the PCB's contact pads 116C.

Further, in many packages, the PCB is based on non-semiconductor substrates (e.g. ceramic or organic substrates) that have significantly different coefficients of thermal expansion (CTE) than the semiconductor die. The CTE mismatch results in lateral stress on the attachments and may cause the attachments to crack or break. ITP 120 provides a buffer that softens the impact of the CTE mismatch between the die and the PCB. For example, if the die are silicon-based ICs, the ITP substrate 120S may be made of silicon to match the die CTE. As to the ITP-PCB thermal mismatch, this mismatch is less damaging because the bonds between the ITP bottom contact pads 120C.B and the PCB contact pads 116C can be larger (due to their larger spacing) and hence stronger.

In the example of FIG. 1, ITP 120 includes through-holes with conductive vias 130 passing through the ITP substrate 120S. At the top of substrate 120S, the interposer's redistribution layer 140 (RDL) includes conductive lines 140L interconnecting the vias 130 and the interposer's contact pads 120C.T as desired. At the bottom of substrate 120S, the vias 130 terminate at contact pads 120C.B attached to the PCB's contact pads 116C. The PCB's contact pads 116C are interconnected by conductive lines 116L as needed to connect the die to each other and possibly to other circuits (not shown) attached to the PCB. Thus, the top contact pads 120C.T, provided by the RDL, match the die's contact pads 110C; the ITP's bottom contact pads 120C.B match the PCB contact pads 116C; the RDL provides the contact redistribution function, and also provides an extra level of interconnects to augment the PCB's lines 116L. An RDL could also be provided at the bottom of the interposer.

The contact pad attachments are shown at 150. These attachments are solder, but can be of other types.

To ensure reliability of attachments 150 at the top of the interposer, each die's contact pads 110C should all be at the same height; otherwise, if any contact pad 110C is higher than others, the higher contact pad 110C will not reach the corresponding contact pad 120C.T. Likewise, the ITP and PCB contact pads should be at the same height at each side of the ITP. The height uniformity can be disturbed by manufacturing variations and by warpage of the die, the interposer, or the PCB. If connections 150 are solder, the non-uniform height can be partially compensated by making the solder balls sufficiently large, but larger solder balls spread farther sideways to possibly create electrical shorts.

Also, to strengthen the attachment between the microelectronic components, underfill 160 ("UF") is placed between adjacent components to glue them to each other. A typical underfill material is an organic polymer (e.g. epoxy), possibly with fillers. Commonly used organic polymers have a high CTE compared to silicon. The CTE mismatch undesirably increases warpage which complicates attachment of component assemblies to other circuits and also increases the up-down (vertical) stresses on the contact pad attachments 150 to reduce reliability. The underfill's CTE can be lowered by fillers (additives), but the underfill material has to meet stringent requirements which limit the choice and use of such fillers. Indeed, the underfill should spread between the components without voids. The underfill can be introduced at edges of the components after the components have been attached to each other, and the underfill must flow into the gap between the components to fill the gap within reasonable time and to cure (solidify) without voids. Alternatively, the underfill can be introduced before the attachment of the components to each other, and then the underfill must be reliably pierced by the components' contact pads to establish a low-resistance connection of the contact pads to each other and must cure without voids. These requirements place limitations on the underfill material and reduce the yield of the manufacturing process.

SUMMARY

This section summarizes some features of the invention. Other features may be described in the subsequent sections. The invention is defined by the appended claims, which are incorporated into this section by reference.

Some embodiments of the present invention provide novel attachment techniques for microelectronic components. Conventionally, the contact pads of microelectronic components are made of metal because metal has high electrical conductivity. However, in some embodiments of the present invention, one component's contact pads are made of metal while the other component has silicon at contact pad locations. When the components are attached to each other, the metal reacts with silicon to form a conductive metal silicide.

Attachment of a metal pad to a silicon pad to form a silicide bond has been described in U.S. patent publication no. 2010/0224994 (Sep. 9, 2010, inventor: Yun). However, the metal silicide may have relatively high resistivity, and some embodiments of the present invention allow at least partial replacement of metal silicide by metal (or other conductive material, to increase conductivity or for any other reason) after metal silicide formation. How can the metal silicide be reached and replaced in the hard-to-reach area between the components? By means of a hole passing from the outside into one of the components. This hole can be similar to a hole containing a via 130 in FIG. 1. After the silicide removal, metal can be deposited into the hole to replace the silicide and provide conductive vias (similar to 130 in FIG. 1) that can be connected to additional components, e.g. to a PCB.

Some embodiments do not use underfill between the two components. For example, in some embodiments, before attachment to each other, both components are polished flat on the sides that must be attached to each other. Thus, the metal contact pads of one component are level with the surrounding dielectric, and the silicon regions of the other component are level with the surrounding dielectric. When the metal contact pads react with the silicon, the dielectric regions of different components bond together through inter-diffusion. This eliminates the need for an underfill process.

The invention is not limited to the features and advantages described above except as defined by the appended claims.

BRIEF DESCRIPTION OF THE DRAWINGS

FIGS. 2, 3A, 3B, 3C, 4A.1 show vertical cross sections of microelectronic components at different fabrication stages according to some embodiments of the present invention.

FIG. 4A.2 is a top view of a microelectronic component during fabrication according to some embodiments of the present invention.

DESCRIPTION OF SOME EMBODIMENTS

The embodiments described in this section illustrate but do not limit the invention. The invention is defined by the appended claims.

In this disclosure, the term "conductive" means electrically conductivity unless stated otherwise. Similarly, "insulator" means electrical insulation unless stated otherwise. The term "dielectric" means any electrical insulator, not necessarily with a high dielectric constant.

Figure 2:
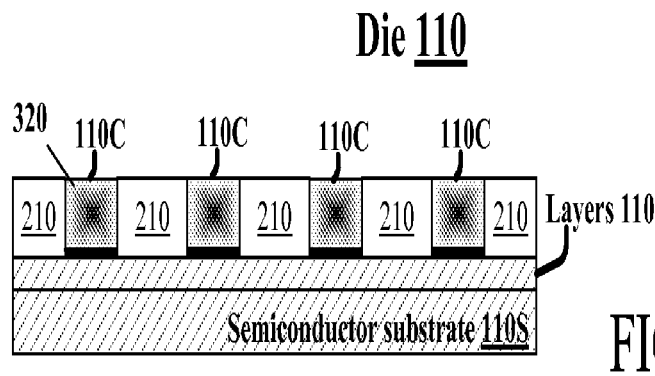

FIG. 2 illustrates a die 110 that can be attached to an interposer as discussed below. The die can be similar to a conventional die. The die of FIG. 2 has a semiconductor substrate 110S (e.g. silicon), additional layers marked "110+", and metal contact pads 110C. Other die structures are possible; for example, the die could have layers beneath the substrate 110S. Further, the die could be replaced by a multichip module (MCM) having multiple die and/or other microelectronic components, e.g. interposers. The die or module may include any circuitry, possibly with semiconductor devices (e.g. transistors, diodes, and others), capacitors, resistors, and/or other elements. The die's circuitry is not shown except for contact pads 110C. Most of the circuitry is covered by passivation layer 210 (dielectric) on top of the die, but contact pads 110C are exposed. These metal contact pads will later react with silicon to form metal silicide regions, so the top surface of contact pads 110C includes metal that will react with silicon to provide a desired silicide. Suitable metals include nickel, cobalt, titanium, tungsten, platinum, palladium, molybdenum, tantalum and their combinations, and possibly others.

Figure 3A:
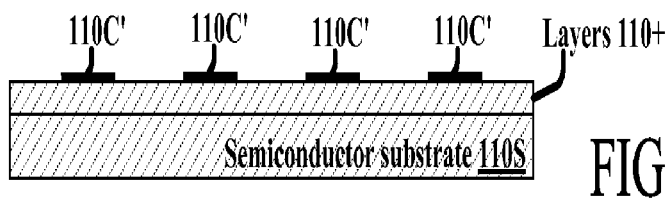
Figure 3B:
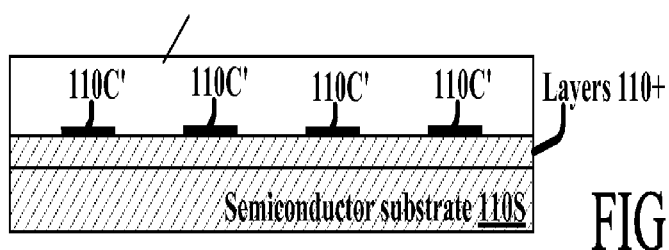
Figure 3C:
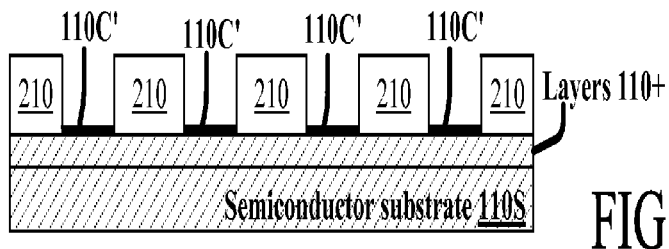

The die or module 110 can be fabricated using conventional processes, or a conventionally-fabricated die or module can be further processed to provide the desired metal of sufficient thickness at the top of contact pads 110C. For example, FIG. 3A shows a conventional die 110' that can be so processed. Die 110' has contact pads 110C', but in order to form the silicide it may be desirable to have thicker contact pads and/or thicker dielectric around the contact pads and/or a different kind of metal in the contact pads. For these or other purposes, possibly before the die 110' is separated from its wafer, passivation layer 210 (FIG. 3B), e.g. silicon dioxide (possibly glass) or silicon nitride or some other dielectric made of organic and/or inorganic materials, is deposited on top by chemical vapor deposition (CVD) or physical vapor deposition (PVD) or printing or molding or some other process, to a thickness of 1 μm or some other suitable thickness based on the desired thickness for the contact pads. Passivation 210 is patterned to expose the contact pads 110C' (FIG. 3C). Then (FIG. 2) suitable metal 320 is deposited on contact pads 110C' to increase their height, thus providing the contact pads 110C. The resulting contact pads are shown as 110C. They are level with the top surface of passivation 210, or they may protrude above the top surface. Metal 320 can be deposited, for example, by depositing a copper layer by CVD or electroless plating, or some other process (e.g. sputtering a thin layer of copper and then augmenting this layer by electroplating), and then by depositing a layer of nickel by electroplating or electroless plating or MOCVD (metalorganic chemical vapor deposition), or some other process. Nickel is suitable for nickel silicide formation, and nickel impedes copper diffusion into the interposer (the interposer is not shown). In an exemplary copper/nickel embodiment, the top nickel layer in contact pads 110C is 100 to 500 nm thick.

Of note, metal 320 may initially cover passivation 210, but can be removed from over passivation 210 by chemical mechanical polishing (CMP) or a suitable etch or some other process. These examples are not limiting.

Figure 4B:
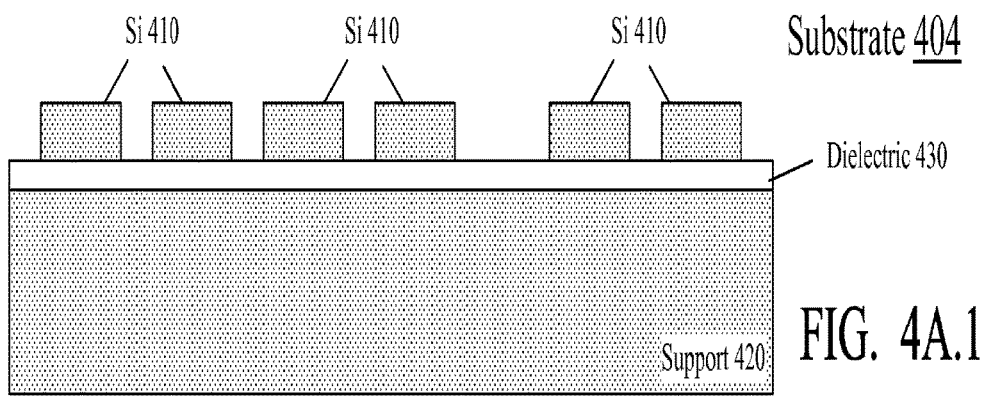
FIGS. 4B, 5A, 5B, 5C, 5D, 5E, 5F, 5G, 6, 7A, 7B, 8A, 8B, 8C, 9A, 9B show vertical cross sections of microelectronic components at different fabrication stages according to some embodiments of the present invention.
Figure 4B:
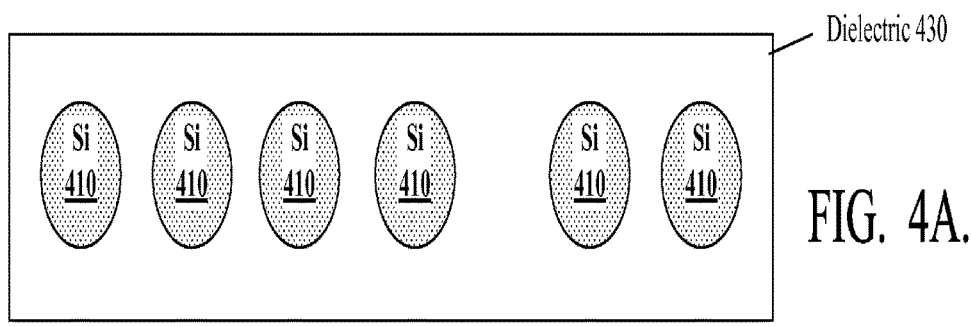
Figure 4B:
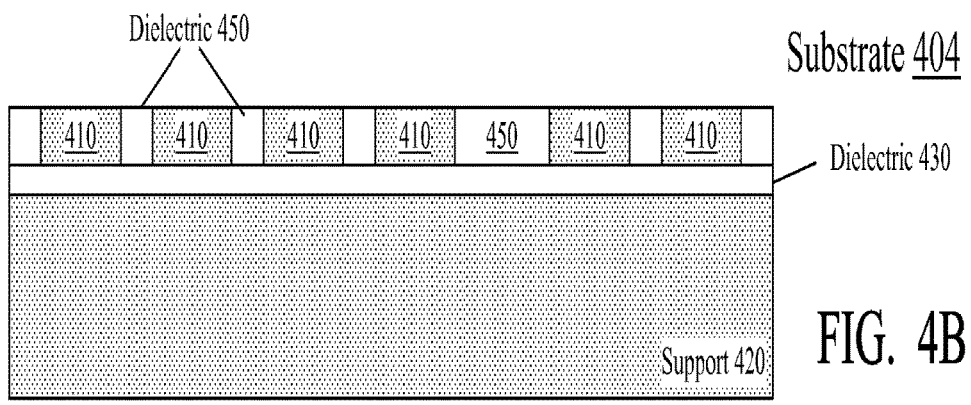

FIGS. 4A.1 (vertical cross section) and 4A.2 (top view) illustrate beginning stages of interposer fabrication. The interposer includes a substrate 404 with silicon regions (islands or mesas) 410. In the embodiment shown, islands 410 are formed over a support 420. Support 420 can be any suitable material, e.g. silicon or some other semiconductor, or can be ceramic, organic or inorganic, and can possibly be a laminate of layers of the same or different materials. Support 420 and/or islands 410 may have been provided with circuitry (not shown) including conductive interconnect lines, capacitors, transistors, and possibly other circuit elements. An optional dielectric 430 can be provided between support 420 and silicon regions 410 to help insulate the silicon regions 410 from each other and the substrate if the top substrate surface is not dielectric.

In exemplary embodiments, the structure of FIGS. 4A.1, 4A.2 is fabricated as follows. Dielectric 430 is formed on support 420; then a polysilicon layer is deposited and photolithographically patterned on dielectric 430 to form the silicon regions 410. In another example, layers 410, 420, 430 are part of a commercially available SOI (Silicon On Insulator) wafer, with layers 410 and 420 being monocrystalline silicon, and layer 430 being silicon dioxide ("buried oxide"). These examples are not limiting.

As shown in FIG. 4A.2, silicon regions 410 are spaced from each other. Silicon regions 410 are shown as circular, but they may have any other geometry and may be distributed in any pattern, e.g. an array or some other pattern. There can be any number of regions 410, possibly just one such region. The regions may have any dimensions. For illustration, each region 410 may have a height of 10 to 200 nm (in the view of FIG. 4A.1) and a diameter of 0.5 µm to 500 µm, but this is not limiting.

Optionally (FIG. 4B), the areas between silicon regions 410 are filled by dielectric 450, e.g. silicon dioxide or silicon nitride or some other kind, organic or inorganic or a combination of the two, formed by CVD or PVD or spin-on or printing or molding or some other process. In some embodiments, dielectric 450 is initially deposited to cover the entire structure and then is polished by CMP to provide a planar top surface level with the top surface of silicon 410.

Figure 5A:
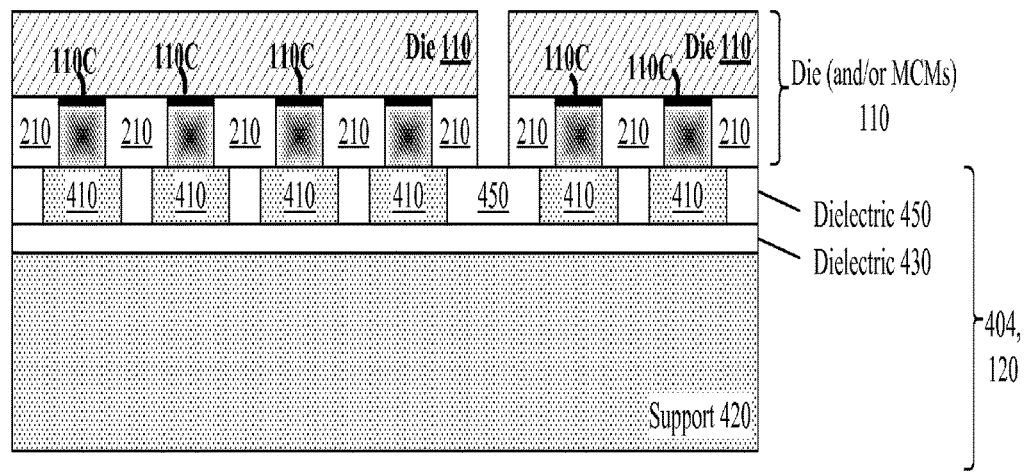

As shown in FIG. 5A, one or more die 110 (or MCMs) are placed on interposer 120 upside down so that the die's contact pads 110C are positioned above the silicon regions 410. Each die 110 can be as described above in connection with FIG. 2; substrates 110S and layers 110+ are not shown separately. As noted above, various die or MCM architectures can be used.

Then (FIG. 5B) the junctions at which silicon 410 meets contact pads 110 (e.g. metal 320 in FIG. 2) are heated, possibly by convection or electromagnetic radiation (such as laser), to cause the contact pad metal 110C to react with the silicon 410 and form a layer of metal silicide 504 bonding the die to the interposer. In the embodiment shown, only part of silicon 410 is consumed by the silicide, but all of silicon can be consumed in some embodiments. Exemplary process parameters for this silicidation process are as follows:

TABLE 1

Silicidation Parameters

| Metal 110C | Silicide 504 | Sintering T° (° C.) | Heating time (minutes) | Silicide thickness (nm) | Silicide resistivity (µΩcm) |
|---|---|---|---|---|---|
| Nickel | NiSi | 400-600 | 30 sec. to 10 min. | 10 nm | 14-20 |
| Cobalt | $Co_2Si$ | 300-500 | 30 sec. to 10 min. | 10 nm | 70 |
| Cobalt | CoSi | 400-600 | 30 sec. to 10 min. | 10 nm | 100-150 |
| Platinum | PtSi | 250-400 | 30 sec. to 10 min. | 10 nm | 28-35 |

Other metals and process parameters are possible, including those in well-known silicidation processes. Multiple die or MCMs can be attached to the interposer by silicidation simultaneously or at different times, e.g. one by one. The structures 110 can be any microelectronic components, possibly a whole wafer, such as a monolithic wafer or a reconstituted wafer, i.e. a wafer reconstituted from individual die held together by an adhesive such as an organic encapsulant; see e.g. U.S. Pat. No. 7,901,989 issued Mar. 8, 2011 to Haba et al. and incorporated herein by reference. (Of note, the die fabrication steps described above in connection with FIGS. 3A-3C can be performed on a reconstituted wafer.)

Figure 5B:
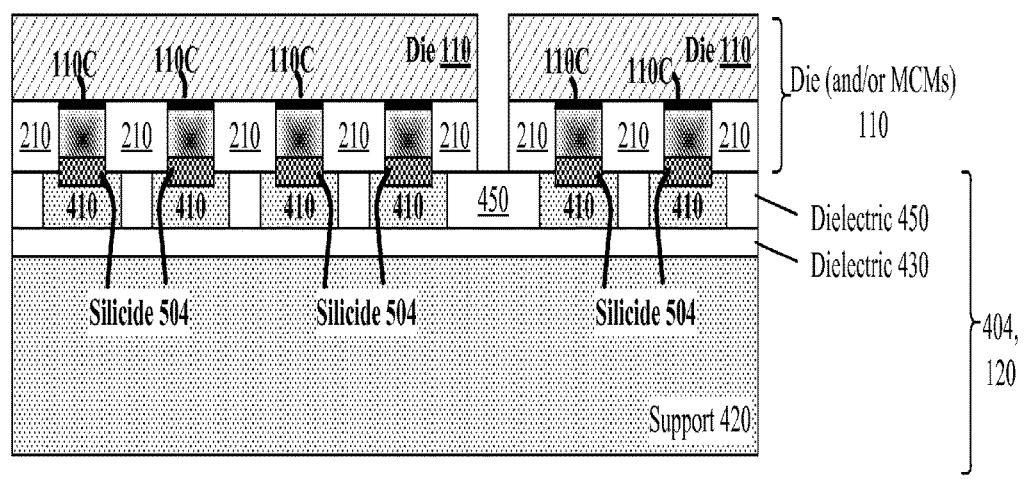

As seen in FIGS. 5A-5B, in some embodiments, dielectric 450 physically contacts dielectric 210. In some embodiments, during the silicidation process, and/or before and/or after the silicidation, dielectric 450 and dielectric 210 bond together to strengthen the attachment of die 110 to interposer 120. For example, in some embodiments, dielectrics 210 and 450 are silicon dioxide and can be bonded together by holding them at about 350° C. for 30 minutes. The dielectric bonding eliminates the need for an underfill process.

Figure 5C:
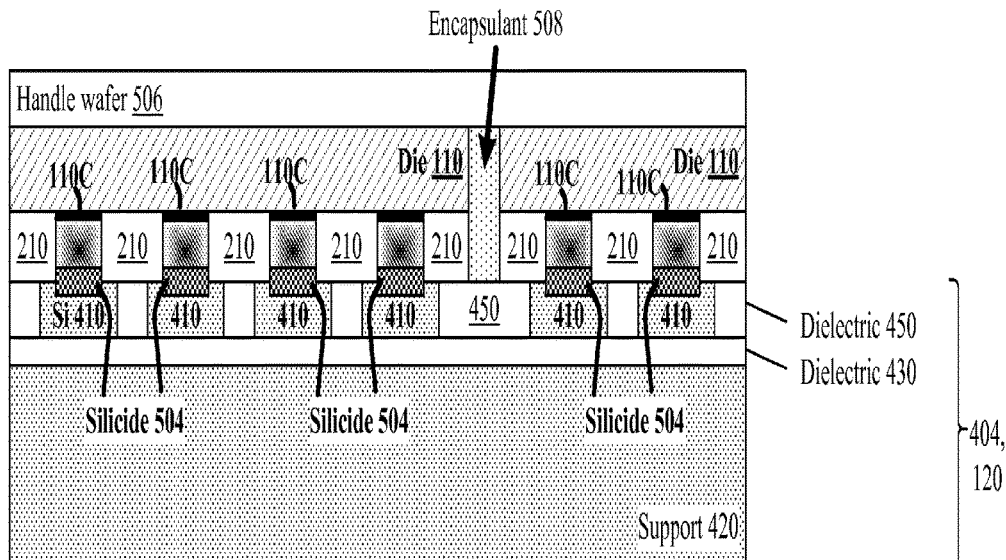

If desired (FIG. 5C), encapsulant 508 (e.g. organic-polymer-based molding compound) can be formed between the die and possibly over the die, by molding or spin-on or some other process, to strengthen the structure and protect the die from the ambient. In addition, a temporary handle wafer 506 can be attached over die 110 to strengthen the structure and improve heat dissipation during subsequent processing. The encapsulant can be formed before the handle wafer attachment. The encapsulant or the handle wafer or both can be omitted. The encapsulant may provide a planar top surface even if the die differ in thickness; the planar top surface facilitates handle wafer attachment if the handle wafer is used, and facilitates subsequent handling of the structure if no handle wafer is used.

For simplicity, the handle wafer 506 and the encapsulant 508 are not shown in subsequent drawings.

Figure 8A:
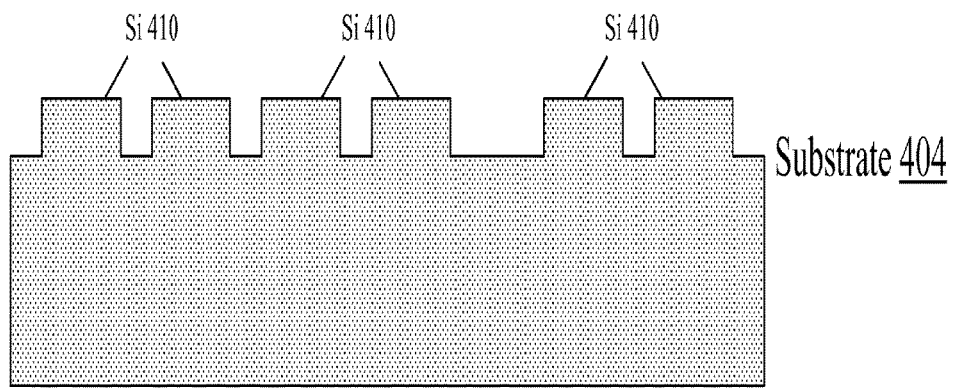
Figure 8B:
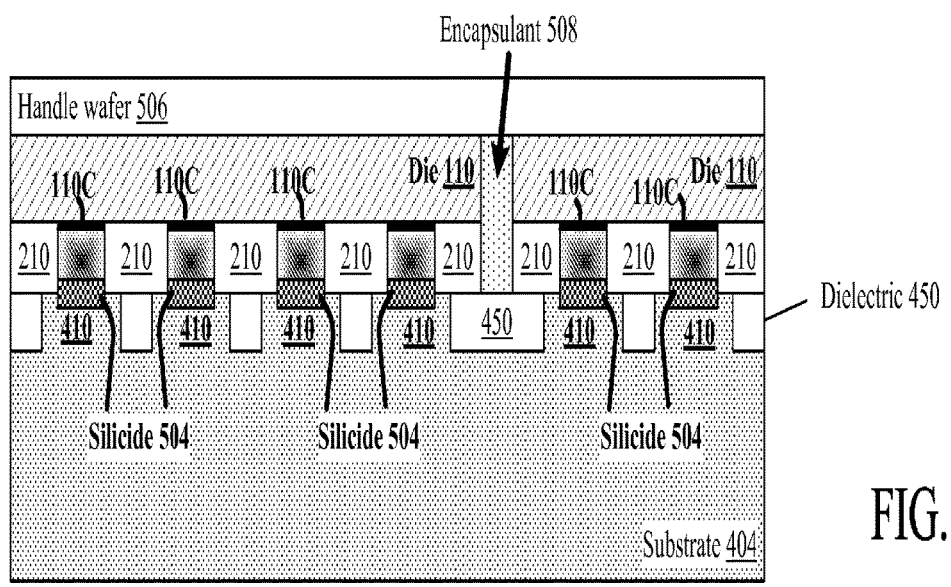
Figure 8C:
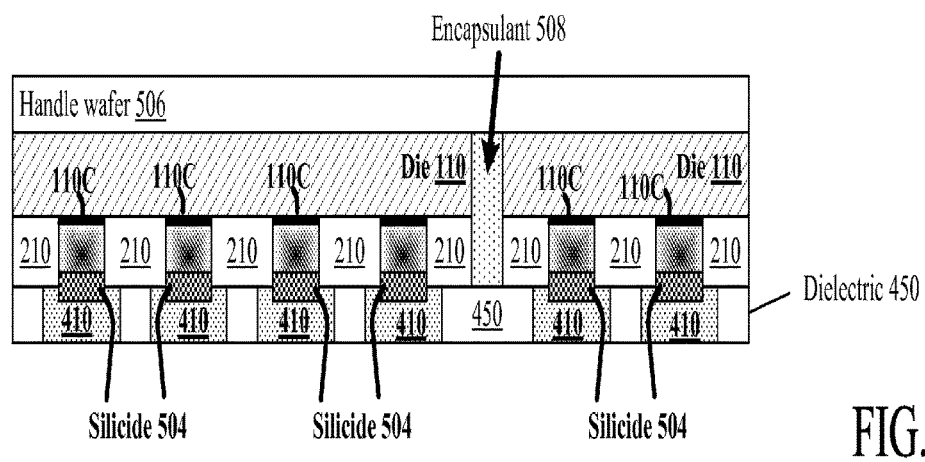

If desired, support 420 may be thinned at this stage—support 420 may have been initially thick to provide greater mechanical strength and heat dissipation at the previous fabrication stages. In some embodiments, support 420 is entirely removed to expose the dielectric 430 on the bottom. In some embodiments, dielectric 430 is also thinned or entirely removed. This thinning or removal of the support or the dielectric is not represented in FIG. 5C but a possible variation is illustrated in FIGS. 8A-8C described below.

Figure 5D:
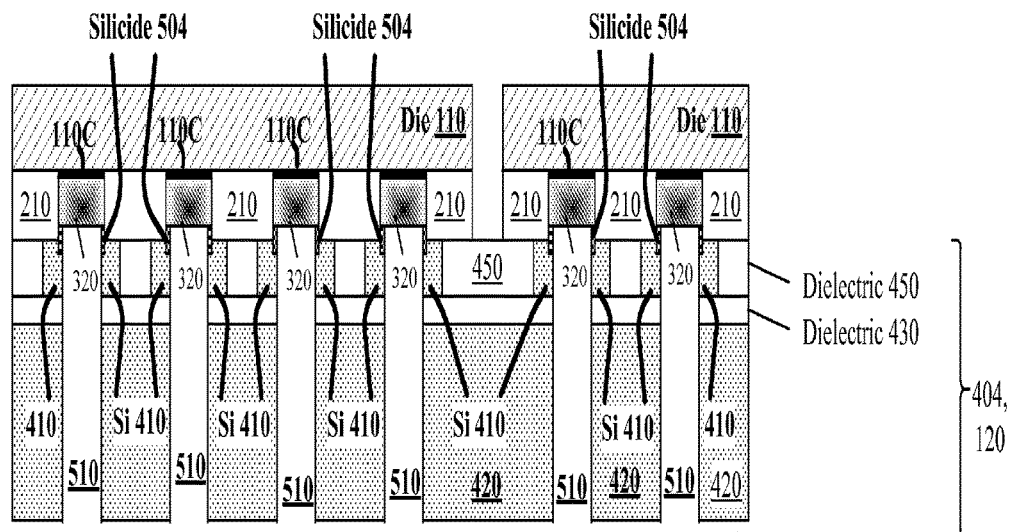
Figure 5D:
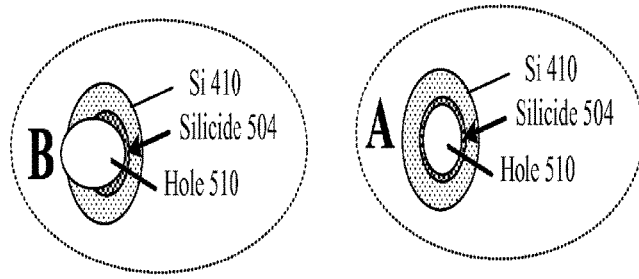

Then (FIG. 5D) holes 510 are made in the bottom side of substrate 404, i.e. the side opposite to die 110. (The words "top" and "bottom" are for ease of reference to the drawings, but the structure can be upside down or at any angular orientation at any stage of fabrication or subsequent use unless noted otherwise.) Holes 510 pass through the support 420, dielectric 430 and unreacted silicon 410 and reach the silicide 504. In the embodiment shown, holes 510 pass through the silicide 504 and reach the unreacted metal of contact pads 110 (such as metal 320 in FIG. 2). For example, in the copper/nickel embodiment for metal 320, holes 510 may reach and expose the copper.

In some embodiments, a separate hole 510 is made through each silicon island 410.

In the embodiment shown, at each contact pad 110C, the hole 510 is laterally surrounded by corresponding silicide 504 and silicon region 410, as illustrated in insert A (showing the top view). However, the holes can be laterally shifted relative to the regions 504 and 510 and can have any shape, as illustrated in insert B (top view). Also, a hole 510 can be wide enough to consume all of the corresponding silicide 504 and silicon 410. The wide holes are discussed in more detail below.

Figure 5E:
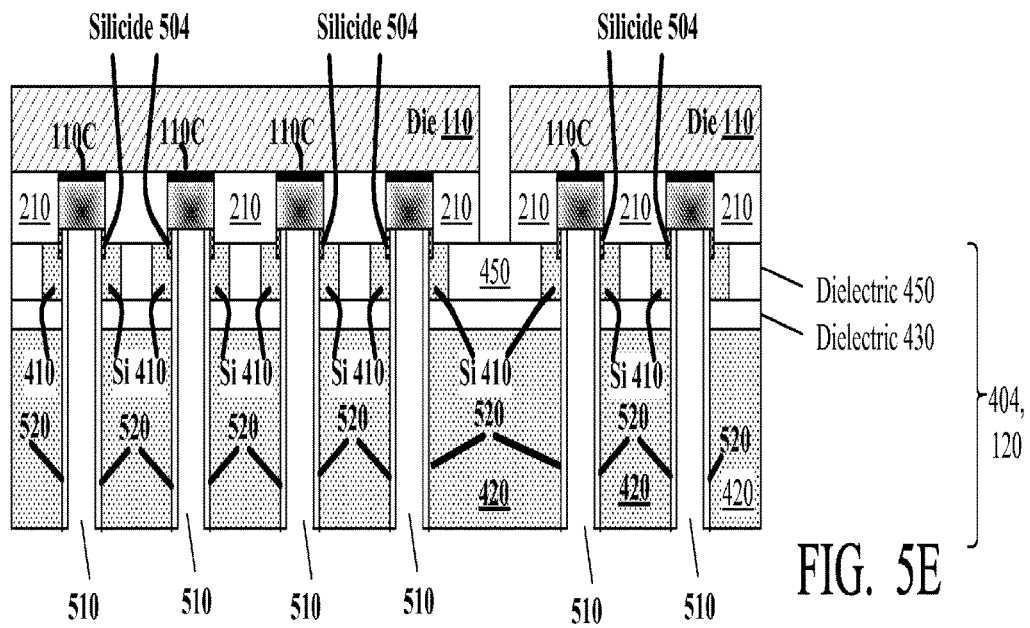

Dielectric 520 (FIG. 5E) is formed over the sidewalls of holes 510. In some embodiments, dielectric 520 initially covers all the surfaces of holes 510 but is then patterned to expose the contact pads 110 at the ends of holes 510. This patterning can be photolithographic or in some other way, e.g. by a vertical anisotropic etch that will remove the dielectric 520 at the ends of holes 510 but not on the holes' sidewalls (the holes' sidewalls may or may not be vertical, but even if they are not vertical the vertical thickness of dielectric 520 can be greater on the sidewalls than on contact pads 110). Dielectric 520 can be omitted, e.g. if support 420 is dielectric.

Figure 5F:
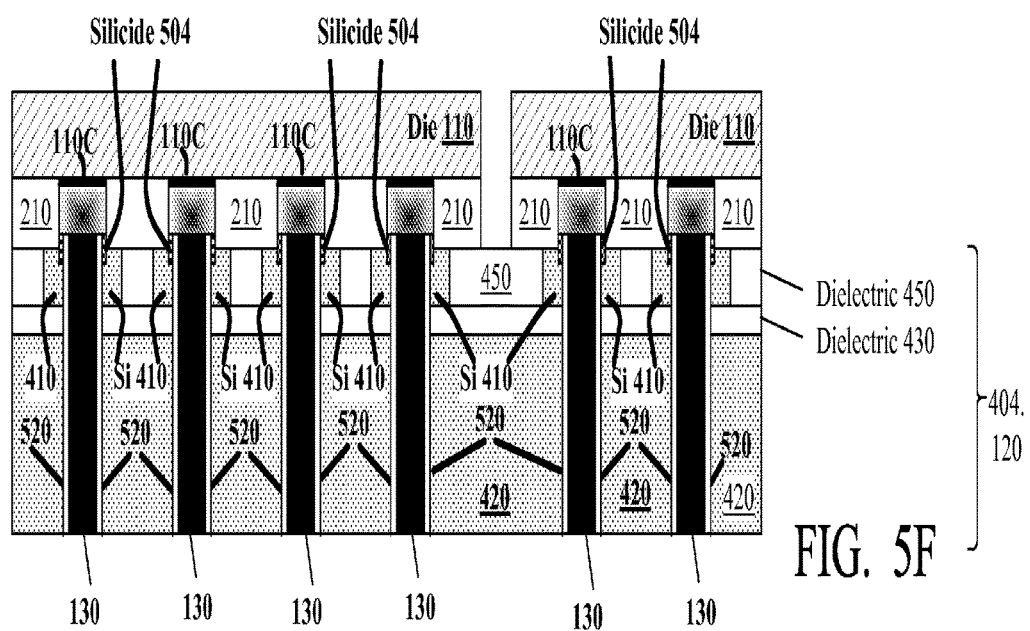

Conductor 130 (FIG. 5F) is deposited into holes 510 to provide conductive vias extending from contact pads 110 to the bottom surface of interposer 120. The vias can fill the holes (as shown), or can cover the holes' surfaces without filling the holes (as a liner); in the liner case, another material can be used to fill the holes to strengthen the structure.

Figure 5G:
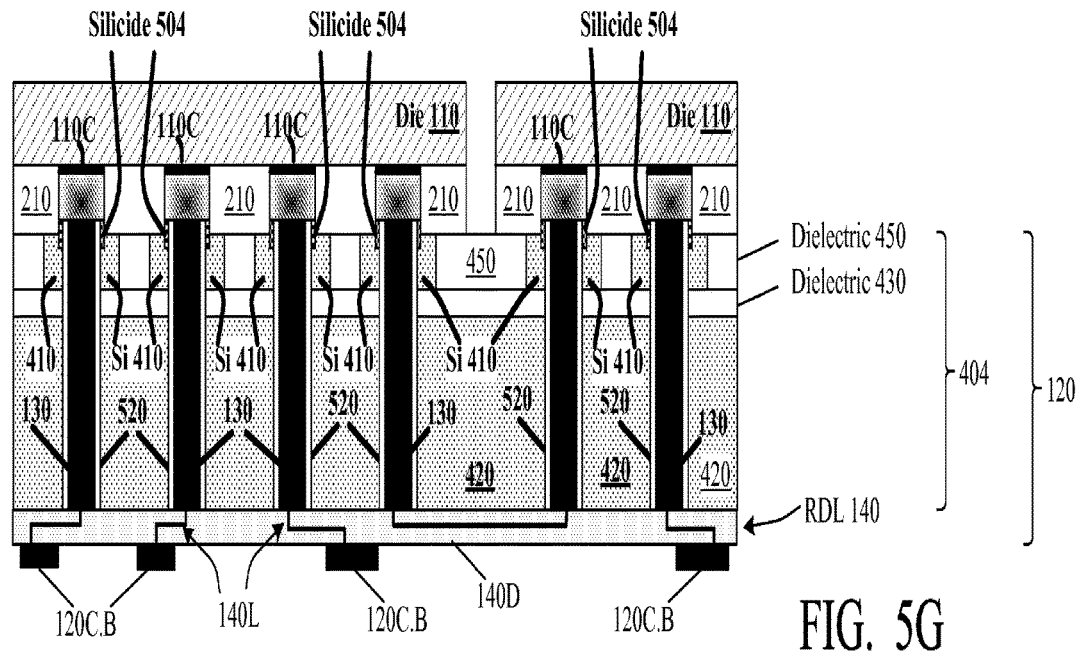

Conductor 130 can be any suitable material. For example, metal can be used that has low resistivity and forms a low resistivity metallurgical junction with the surface of contact pads 110C; if the contact pads' metal is copper or nickel, then conductor 130 can be copper. Known deposition techniques can be used for conductor 130, including CVD, electroless plating, electroplating, or a combination of these and possibly other techniques. If excess metal 130 is formed on the bottom of substrate 404 (i.e. of support 420), such metal can be removed by CMP, etching, and/or other techniques or combination of techniques. Alternatively, some of the metal 130 on the bottom can be patterned to provide some or all of RDL lines 140L (FIG. 5G). If these lines 140L must be insulated from substrate 404, a dielectric layer (part of dielectric 140D of FIG. 5G) can be formed on the bottom of substrate 404 before the metal 130 deposition. The dielectric layer may or may not be formed simultaneously with layer 520.

Figure 1:
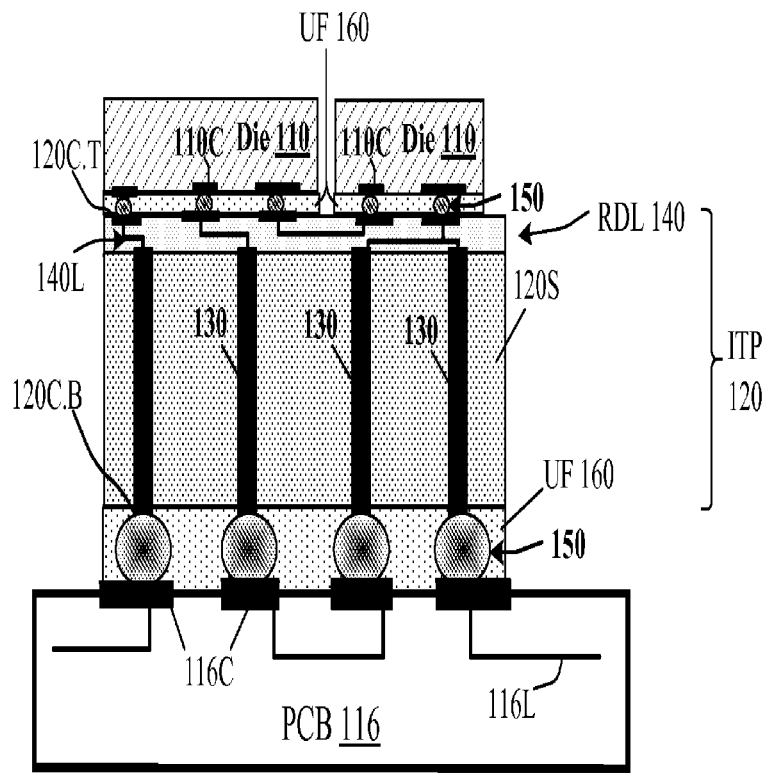
FIG. 1 shows a vertical cross section of an assembly of microelectronic components according to prior art.

Subsequent fabrication can be conventional. For example, in some embodiments, no RDL is formed on the bottom, but the bottom ends of conductive vias 130 provide the interposer's bottom contact pads (like 120C.B in FIG. 1) which can be connected to a PCB (e.g. PCB 116 in FIG. 1) or to other components by solder, thermocompression, conductive or anisotropic adhesive, bond wires, or other types of connections. In the example of FIG. 5G, RDL 140 is formed on the bottom of substrate 404 to redistribute the contact pads as desired and provide the interposer's bottom contact pads 120C.B. In particular, the RDL's conductive lines 140L interconnect the bottom ends of vias 130 and the contact pads 120C.B in any desired pattern. Vias 130 can be connected to each other by lines 140L to provide interconnections between different die 110. Lines 140L can be electrically insulated from each other, and possibly from support 420, by the RDL dielectric 140D. Solder or other types of connections (possibly those mentioned above, not shown) can be used to electrically connect the contact pads 120C.B to other components, e.g. PCB 116 (FIG. 1), using prior art or other techniques.

Figure 6:
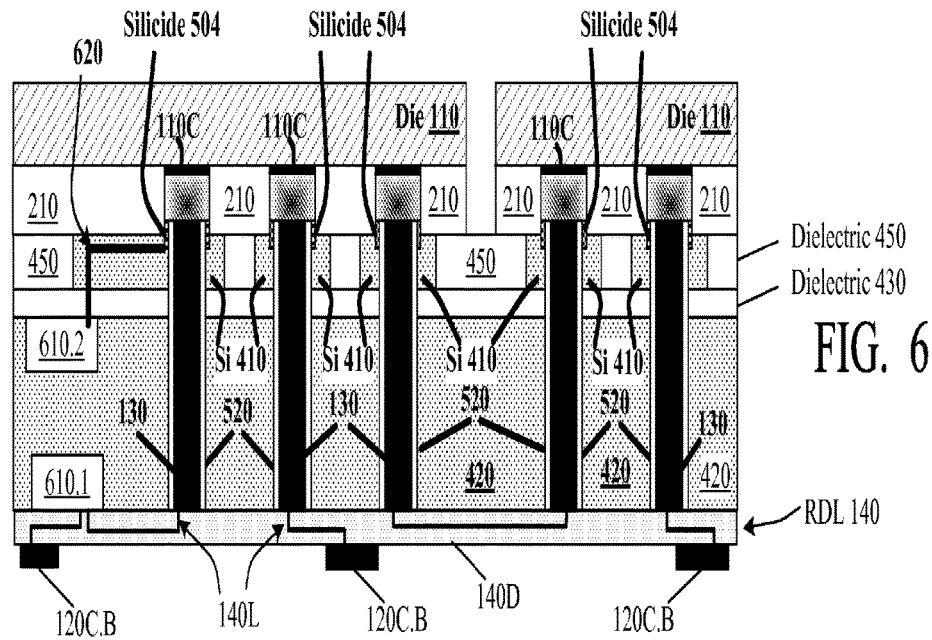

Many variations are possible. For example, support 420 and/or silicon regions 410 may include circuitry with transistors, capacitors, inductors, or other elements, and this circuitry can be connected to die 110 or interposer contact pads 120C.B. One example is shown in FIG. 6, which is similar to FIG. 5G but with support 420 including circuit elements 610.1 and 610.2. Circuit element 610.1 at the bottom is connected to a contact pad 120C.B and a via 130 by RDL lines 140L. Circuit element 610.2 at the top of support 420 is connected to a silicide region 504 by a conductive path 620 passing through the dielectric 430 (a suitable opening in dielectric 430 can be made before or after deposition of silicon 410). Conductive path 620 may include one or more conductive lines formed at the stage of FIGS. 4A.1-4A.2 or 4B or at any other time before the attachment of die 110 to the interposer. Of note, all or part of silicon 410 can be made conductive by doping to provide all or part of conductive path 620.

Figure 7A:
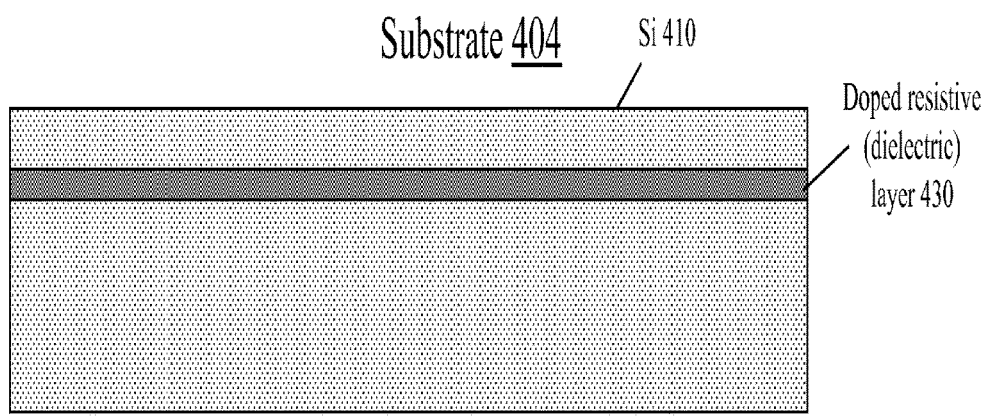
Figure 7B:
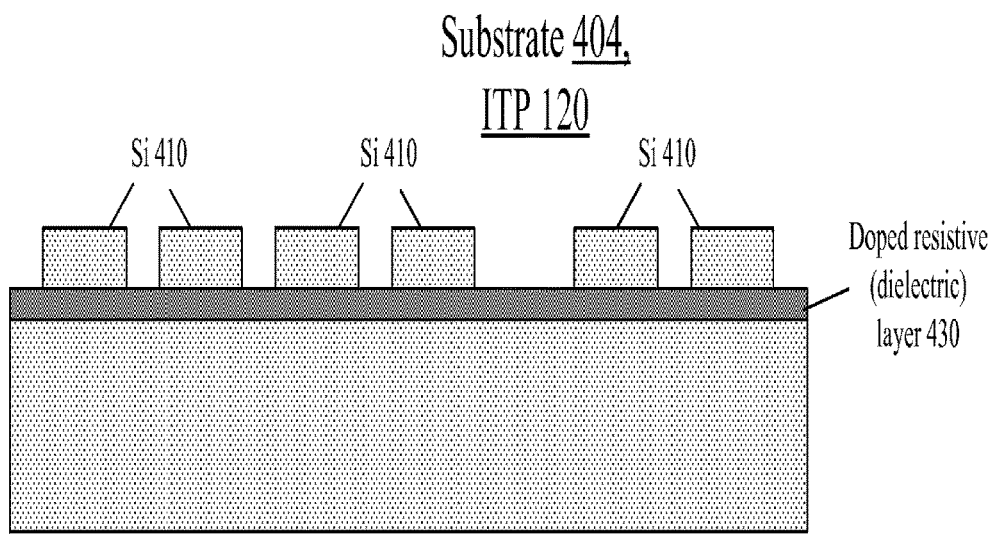

As seen from the above, in the embodiments of FIGS. 5G and 6, optional dielectric 430 insulates the silicon regions 410, and hence the contact pads 110C, from each other. (If support 420 is dielectric or has a dielectric top surface, then dielectric 430 can be omitted.) In some embodiments described above, dielectric 430 is deposited on support 420 before silicon 410. An alternative embodiment is illustrated in FIGS. 7A-7B. Support 420 is omitted. Entire substrate 404 is silicon. Substrate 404 has been implanted by a suitable species to a suitable depth to form a resistive (dielectric) layer 430. Exemplary implantation species are helium and oxygen. For example, double-charged helium ions, He++, can be implanted at an exemplary energy of around 500 KeV; the dose can be about $10^{14}$ to $10^{16}$ ions/cm$^2$. The implantation depth depends on the desired height of not-yet-formed silicon islands 410; an exemplary depth is 2 µm. Other energies, dosages, and depth values are also possible. For a deeper implant, a heavier implant species could be used, e.g. single-charged oxygen ions, O+, at a higher energy, e.g. 1 to 5 MeV, and possibly a higher dose.

Then (FIG. 7B), substrate 404 is patterned to form silicon islands (mesas) 410 above the layer 430. The patterning can be photolithographic for example, by etching the substrate 404 between the islands 410. The etch may stop at layer 430, or may partially or completely penetrate the layer 430 so that each island 410 would include a top portion of layer 430. Islands 410 may have the same geometry as described above in connection with FIGS. 4A.1-4A.2. Subsequent fabrication steps can be as described above.

Another possible isolation technique is PN junction isolation. More particularly, in FIG. 7A, the implant can be a P or N species such that the implanted layer 430 is conductive but has the opposite conductivity type from the rest of substrate 404 or at least from the underlying portion of substrate 404. The junction between the layer 430 and the underlying portion of substrate 404 can be reverse-biased in operation to block the leakage between the contact pads.

A still another possibility, not relying on layer 430, is to remove the portion of substrate 404 below the regions 410. This can be done by substrate thinning similar to the process described above in connection with FIG. 5C, i.e. thinning or removal of support 420 in FIG. 5C, or similar thinning of substrate 404 in embodiments in which the support 420 and dielectric 430 may or may not be present. One embodiment is illustrated in FIGS. 8A-8C. A silicon substrate 404 (FIG. 8A) is patterned to form regions 410 as protrusions on top of the substrate. Layer 430 is absent in this embodiment. The patterning can be done by a timed etch through openings in a photolithographic mask (not shown) or by other techniques.

Then fabrication proceeds as described above up to the stage of FIG. 5C (silicidation). The resulting structure is shown in FIG. 8B.

Then (FIG. 8C) the portion of substrate 404 below the islands 410 and dielectric 450 is removed, e.g. by mechanical and/or chemical mechanical polishing, and/or chemical etching, and/or some other technique. Islands 410 become insulated from each other by dielectric 450.

Subsequent fabrication can be as described above (formation of holes 510 and vias 130 through islands 410, etc.).

Figure 9A:
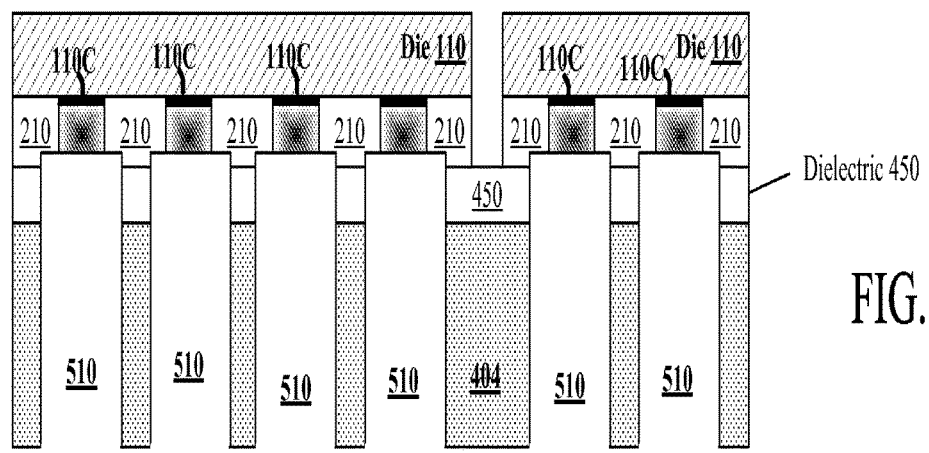
Figure 9B:
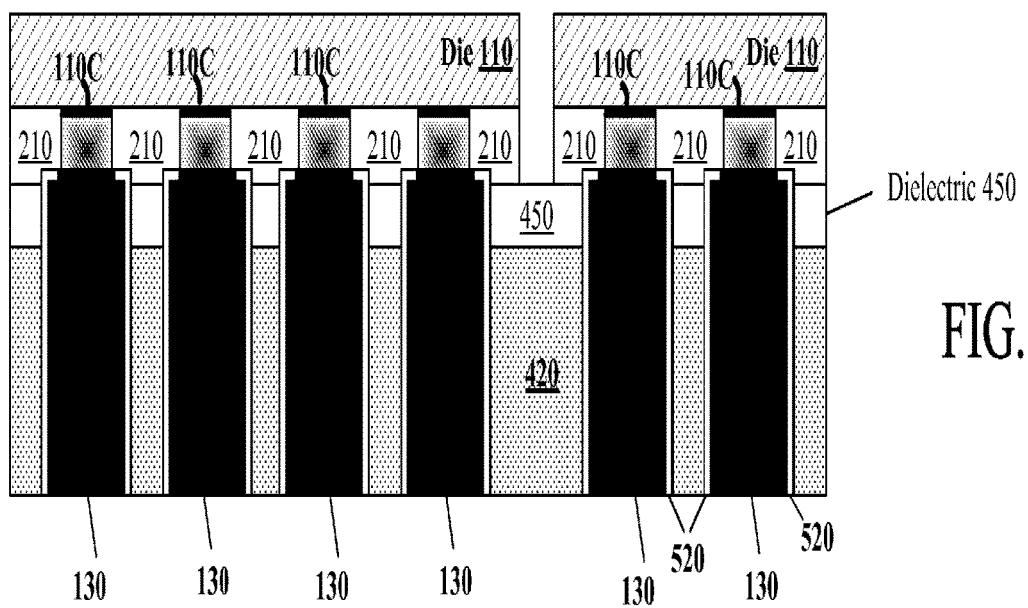

A still another possibility avoiding formation of layer 430 is to remove the unreacted silicon 410. For example, in some embodiments, fabrication proceeds to obtain the structure of FIG. 5C or 8B as described above. Then (see FIG. 9A for the embodiment of FIG. 8B) holes 510 are formed as described above in connection with FIG. 5D, but the holes are as wide or wider than the corresponding islands 410; the unreacted silicon 410 is removed in this process. Silicide 504 may or may not be completely removed (of note, in some embodiments, the holes reach but do not penetrate the silicide as noted above). The holes are spaced from each other, and each hole is aligned with a corresponding contact pad 110C. Then fabrication proceeds as in FIGS. 5E and 5F, to form dielectric 520 and vias 130. (Dielectric 520 is not needed if substrate 404 is dielectric or if substrate 404 is removed between islands 410 (as in FIG. 8C) before or after the hole formation.) The resulting structure is shown in FIG. 9B.

The invention is not limited to the embodiments described above, and in particular to any dimensions or processes, except as defined by the claims. For example, in substrate 404 of FIG. 4B or 8B, the dielectric 430 can be formed by local oxidation of silicon (LOCOS). In such a process, silicon layer 410 is deposited but not etched; rather, silicon regions 410 are masked by silicon nitride and the structure is heated to oxidize the exposed silicon thus forming the dielectric 450. The substrate can later be polished to provide a planar top surface if desired. In some embodiments, the entire interposer 120 is made by printing. Other embodiments are possible.

Silicon regions 410 can be pure silicon or may contain impurities. They consist essentially of silicon in the sense that they can react with metal to form metal silicide to provide a suitable bond. Metal silicide regions 504 also do not have to be pure metal silicide but they provide a suitable bond as needed. For example, in some embodiments, silicon regions 410 are at least 90% by atomic weight silicon before silicidation, and metal silicide regions 504 are at least 90% by atomic weight metal silicide.

Likewise, metal regions such as contact pads 110C or conductive vias 130 may contain non-metal impurities but they consist essentially of metal to provide the corresponding electrical conductivity. For example, in some embodiments, the impurities change the electrical conductivity by at most 10%, and/or the impurities are at most 10% by weight.

Thus, the terms "silicon regions", "metal silicide regions", and "metal regions" mean consisting essentially of silicon, metal silicide, or metal respectively as defined above.

The vias 130 are shown as vertical, i.e. with vertical sidewalls, but they may have sloped sidewalls or sidewalls having any shape. In some embodiments, each via 130 has a vertical portion (e.g. a center portion) extending along the entire via.

Some embodiments are defined by the following clauses:

Clause 1 defines a fabrication method comprising:

providing a first structure (e.g. die or wafer 110) comprising circuitry comprising one or more contact pads (e.g. 110C) each of which comprises metal;

providing a substrate (e.g. 404) comprising a first side comprising one or more silicon regions (e.g. 410), the substrate also comprising a second side opposite to the first side;

attaching the first structure to the substrate so that at least a portion of the metal of each contact pad reacts with at least a portion of the silicon of a corresponding silicon region to form metal silicide;

forming one or more holes (e.g. 510) in the second side of the substrate, each hole reaching the metal silicide formed by reacting at least a portion of the metal of the corresponding contact pad; and forming a conductive via (e.g. 130) in each hole, the conductive via reaching the metal of the corresponding contact pad and/or reaching the corresponding metal silicide, the conductive via extending to the substrate's surface at the second side of the substrate.

Clause 2 defines the method of clause 1 wherein each hole, and the corresponding conductive via, pass at least part way through the metal silicide.

Clause 3 defines the method of clause 1 wherein each hole passes through the metal silicide, and the corresponding conductive via reaches an unreacted metal of the corresponding contact pad.

Clause 4 defines the method of clause 1 wherein:

providing the first structure comprises providing dielectric (e.g. 210) surrounding each contact pad;

providing the substrate comprises providing dielectric (e.g. 450) surrounding each silicon region; and the method further comprises bonding the dielectric surrounding each contact pad with the dielectric surrounding each silicon region.

Clause 5 defines the method of clause 4 wherein the bonding overlaps in time with a silicidation operation in which at least said portion of the metal of each contact pad reacts with at least said portion of the silicon of the corresponding silicon region to form said metal silicide.

Clause 6 defines the method of clause 1 wherein the substrate comprises a non-dielectric region (e.g. below 430) and a dielectric region (e.g. 430) separating the one or more silicon regions from the non-dielectric region.

Clause 7 defines the method of clause 1 wherein providing the substrate comprises:

providing a second structure (e.g. support 420 and dielectric 430) comprising a dielectric surface (e.g. top surface of 430); and forming the one or more silicon regions on the dielectric surface.

Clause 8 defines the method of clause 1 wherein providing the substrate comprises:

providing a silicon substrate (e.g. 404 in FIG. 8A); and removing part of the silicon substrate to form one or more protrusions at the first side of the silicon substrate, each protrusion comprising one of the one or more silicon regions.

Clause 9 defines the method of clause 8 wherein the one or more silicon regions are a plurality of the silicon regions, and the method further comprises implanting a species into the silicon substrate to electrically insulate the silicon regions from each other.

Clause 10 defines the method of clause 1 wherein providing the substrate comprises:

providing a silicon substrate; and forming dielectric (e.g. 450) at a top of the silicon substrate, the substrate comprising one or more silicon regions each of which has a top surface bordering on the dielectric.

Clause 11 defines the method of clause 10 wherein the one or more silicon regions are a plurality of silicon regions whose top surfaces are separated from each other by the dielectric.

Clause 12 defines the method of clause 1 further comprising, after attaching the first structure to the substrate, thinning the substrate from the second side to expose each silicon region at the second side (see FIG. 8C for example).

Clause 13 defines the fabrication method of clause 1 wherein the one or more silicon regions are a plurality of the silicon regions electrically insulated from each other.

Clause 14 defines a microelectronic component comprising:

a first structure (e.g. 110) comprising circuitry comprising one or more metal regions (e.g. 110C) at a bottom of the first structure;
for each metal region,
at least one corresponding silicon region (e.g. 410);
at least one metal silicide region physically contacting the metal region and the corresponding silicon region;
at least one conductive via reaching the corresponding metal region and/or the corresponding metal silicide region from below the silicon region;
the microelectronic component further comprising, at its bottom side, one or more contact pads for attachment to circuitry, each of the one or more contact pads being electrically coupled to at least one of the one or more conductive vias.

Clause 15 defines the assembly of clause 14 wherein each conductive via passes through the corresponding metal silicide region and reaches the corresponding metal region.

Clause 16 defines the assembly of clause 14 or 15 wherein each conductive via passes through the corresponding silicon region.

Clause 17 defines the assembly of clause 14, 15, or 16 wherein each conductive via is made essentially of metal.

Clause 18 defines the assembly of clause 14, 15, 16, or 17 wherein the one or more silicon regions are formed on a dielectric layer, and each conductive via passes through the dielectric layer.

Clause 19 defines the assembly of clause 14, 15, 16, 17, 18, or 19 wherein the one or more silicon regions are a plurality of silicon regions electrically insulated from each other.

Clause 20 defines the assembly of clause 14, 15, 16, 17, 18, or 19 wherein the one or more silicon regions are electrically insulated from each conductive via.

Clause 21 defines the assembly of clause 14, 15, 16, 17, 18, 19, or 20 wherein each conductive via comprises a vertical portion extending along the entire conductive via.

Other embodiments and variations are within the scope of the invention, as defined by the appended claims.

The invention claimed is:

1. A fabrication method comprising:
providing a first structure comprising circuitry comprising one or more contact pads each of which comprises metal, the first structure comprising first dielectric surrounding each contact pad;
providing a substrate comprising a first side comprising one or more silicon regions each of which is surrounded by second dielectric;
attaching the first structure to the substrate so that the first dielectric physically contacts the second dielectric and so that at least a portion of the metal of each contact pad reacts with at least a portion of the silicon of a corresponding silicon region to form metal silicide.

2. The method of claim 1, comprising bonding the first dielectric with the second dielectric.

3. The method of claim 2 wherein each of the first dielectric and the second dielectric is silicon dioxide.

4. The method of claim 2, wherein the bonding overlaps in time with a silicidation operation in which at least said portion of the metal of each contact pad reacts with at least said portion of the silicon of the corresponding silicon region to form said metal silicide.

5. The method of claim 1 wherein in said attaching, a first surface of each contact pad meets a first surface of at least one corresponding silicon region of the substrate to form said metal silicide; and immediately prior to said attaching, the first surface of each contact pad is level with at least one surface of the first dielectric.

6. The method of claim 1 wherein in said attaching, a first surface of each contact pad meets a first surface at least one corresponding silicon region of the substrate; and immediately prior to said attaching, the first surface of each silicon region is level with at least one surface of the second dielectric.

7. The method of claim 1 wherein immediately prior to said attaching, at least one said contact pad protrudes out of the first dielectric.

8. The method of claim 1 wherein immediately prior to said attaching, the substrate comprises a circuit element and a conductive path connected to the circuit element; and in said attaching, the conductive path becomes connected to said metal silicide, connecting the metal silicide to the circuit element.

9. The method of claim 8 wherein the circuit element is a transistor.

10. The method of claim 1 further comprising, after said attaching:
forming one or more holes in a second side of the substrate, the second side being opposite to the first side, each hole reaching the metal silicide formed by reacting at least a portion of the metal of the corresponding contact pad; and
forming a conductive via in each hole, the conductive via reaching at least one of the metal of the corresponding contact pad and the corresponding metal silicide.

11. A microelectronic component comprising:
a substrate comprising one or more silicon regions at a top side of the substrate; and
a first structure comprising circuitry comprising one or more contact pads at a bottom side of the first structure, wherein each said contact pad comprises metal and overlies at least one corresponding silicon region at the top side of the substrate;
wherein for each said contact pad, the microelectronic component comprises:
a metal silicide region underlying and physically contacting the contact pad and overlying and physically contacting the corresponding silicon region, wherein the metal silicide is a compound of silicon and the same metal as present in the contact pad; and
a dielectric region surrounding and physically contacting the contact pad, the metal silicide region, and the silicon region.

12. The microelectronic component of claim 11 wherein:
for each contact pad, the first structure comprises a first dielectric region surrounding and physically contacting the contact pad;
for each silicon region, the substrate comprises a second dielectric region surrounding and physically contacting the silicon region; and
each said dielectric region comprises at least one said first dielectric region and at least one said second dielectric region.

13. The microelectronic component of claim 12 wherein for at least one said contact pad, the dielectric region is silicon dioxide.

14. The microelectronic component of claim 11 wherein the substrate comprises a circuit element and a conductive path interconnecting the circuit element and the metal silicide.

15. The microelectronic component of claim 14 wherein the circuit element is a transistor.

16. The microelectronic component of claim 11 wherein the one or more silicon regions are a plurality of silicon regions which are electrically insulated from each other.

17. The microelectronic component of claim 11 further comprising, for at least one said contact pad, a metal via electrically coupled to at least one said contact pad and extending down through the corresponding silicon region.

18. The microelectronic component of claim 17 wherein the metal via is connected to a contact pad on a bottom of the substrate.

19. The microelectronic component of claim 17 wherein the metal via is located in a hole extending down through the corresponding silicon region.

* * * * *